United States Patent [19]
Schubert et al.

[11] Patent Number: 5,850,143
[45] Date of Patent: Dec. 15, 1998

[54] ANTENNA SYSTEM FOR A DIAGNOSTIC MAGNETIC RESONANCE APPARATUS

[75] Inventors: Berhard Schubert, Adesdorf; Claus Rupp, Erlangen, both of Germany

[73] Assignee: Siemens Aktiengesellschaft, Munich, Germany

[21] Appl. No.: 843,266

[22] Filed: Apr. 14, 1997

[30] Foreign Application Priority Data

Apr. 17, 1996 [DE] Germany .......................... 19615184.8

[51] Int. Cl.⁶ .......................................... G01V 3/00
[52] U.S. Cl. .......................................... 324/318; 324/322
[58] Field of Search .................................. 324/318, 322, 324/309, 307, 314, 300; 128/653.5

[56] References Cited

U.S. PATENT DOCUMENTS

| | | | |
|---|---|---|---|
| 4,897,604 | 1/1990 | Carlson et al. | 324/318 |
| 4,924,868 | 5/1990 | Krause et al. | 324/318 |
| 4,973,907 | 11/1990 | Bergman et al. | 324/318 |
| 5,327,898 | 7/1994 | Yoshino et al. | 324/318 |

*Primary Examiner*—Louis M. Arana
*Attorney, Agent, or Firm*—Hill & Simpson

[57] ABSTRACT

An antenna system for a diagnostic magnetic resonance apparatus has a first conductor piece arranged in a base part and a number of bridge parts of different lengths with second conductor pieces. Electrical connection terminals are arranged at the ends of the base part and the bridge parts, which means are respectively electrically connected with the ends of the conductor pieces. The electrical connection terminal at a first end of the base part has a number of contacts corresponding to the number of different bridge parts. One contact is assigned to each of the different bridge parts. A network of capacitive elements is arranged between the first end of the first conductor piece and the contacts. The network is fashioned so that an overall impedance formed by the two conductor pieces and by the network is substantially equally large for all bridge parts.

9 Claims, 3 Drawing Sheets

ANTENNA SYSTEM FOR A DIAGNOSTIC MAGNETIC RESONANCE APPARATUS

BACKGROUND OF THE INVENTION

The present invention is directed to an antenna system of the type suitable for use in a diagnostic magnetic resonance apparatus 1. Description of the Prior Art An antenna system for a diagnostic magnetic resonance apparatus is known from U.S. Pat. No. 4,897,604 having a first conductor piece arranged in a base part and a number of bridge parts, of different lengths, and second conductor pieces, with electrical connection means arranged at the ends of the base part and the bridge parts. The electrical connection means are respectively electrically connected with the ends of the conductor pieces, so that the base part and one of the bridge parts can be assembled via the electrical connection means to form an antenna that surrounds an imaging volume. This antenna has a circumferential length that can be matched to the size of the imaging volume.

A higher antenna filling factor is sought, in order to achieve a high signal-noise ratio. The more tightly the antenna surrounds the imaging volume, the higher the filling factor. A tuning and matching unit is connected to the antenna system, whereby the antenna is tuned to the operating frequency, and is matched to the wave resistance. To avoid enlarging the setting range of the tuning and matching unit is not enlarged by the use of bridge parts of different lengths, one compensating capacitor is inserted into each bridge part, which compensates the inductance of the antenna conductor piece arranged in that bridge part at the operating frequency. As with antennas that cannot be matched to the size of the imaging volume, the setting range is determined only by a the influence of different patients on the antenna. This is obtained, however, at the price of an expensive construction of the bridge parts. The insertion of the capacitor into the conductor piece of the bridge part requires additional manufacturing and adjustment steps.

U.S. Pat. No. 4,733,190, a local antenna is known that has two antenna modules spaced axially relative to one another. The imaging volume is located between the two antenna modules. The antenna modules can be plugged onto a base part at various distances relative to one another. For this purpose, the base part has a number of plug sockets that are connected with capacitors. The capacitance values of the capacitors are selected so that they compensate changes in the resonance frequency caused by the varying distances of the antenna modules. Antenna modules of varying sizes can also be used in the base part, provided that the antenna modules themselves are tuned to the same resonance frequency.

SUMMARY OF THE INVENTION

An object of the invention is to provide an antenna system in which the length can be matched to the size of the region being examined, by means of bridge parts that are of various lengths and simple construction, and wherein the setting range of the tuning and matching circuit remains independent of the length of the bridge parts that can be used.

The object is achieved in an antenna system wherein the electrical connection means connected to a first end of the base part has a number of contacts that corresponds to the number of different bridge parts, with one of the contacts assigned to each of the different bridge parts, and having a network of capacitive elements arranged between the first end of the first conductor piece and the contacts. The network is fashioned so that an overall impedance formed by the two conductor parts and the network is essentially equally large for all the bridge parts. The bridge parts can thus be manufactured at low cost without additional processing steps during manufacturing. In addition, the electrical antenna adjustment is uncritical and is well-suited for series production. Due to the simple bridge construction, manufacturing-related tolerances are small enough so that no readjustment is required in the testing field. Due to the simple construction, the bridge parts are also rugged and easy to handle.

In one embodiment a tuning and matching unit is arranged on the base part, and the network forms a structurally integrated unit with the tuning and matching unit. All electrical components required in addition to the conductor pieces are thus arranged in a unit that can be manufactured as a whole.

In a further embodiment additional conductor pieces are arranged in the base part, the ends of these conductor pieces being respectively connected to additional contacts of the electrical connection means. A different number of additional conductor pieces are respectively arranged in additional bridge parts, the ends of these additional conductor pieces being respectively connected to additional contacts of the electrical connection elements and, with a conductor piece arranged in the base part, respectively form an additional winding of the antenna. A capacitive element is inserted in each of the conductor pieces arranged in the base part, in order to largely compensate the portion of the overall impedance of the antenna formed by the winding. The diameter of the antenna surrounding the imaging volume, together with the number of windings, has a large influence on the magnetic field and the quality of the antenna, and thus also on the image quality. Thus, for a small diameter a larger number of windings are required in order to achieve the best possible image quality than for a large coil diameter. In the base part, a part of the winding is arranged as a conductor piece, which is supplemented to form complete windings by a number of additional parts of the winding, arranged in the bridge part, dependent on the length of the bridge part. The unnecessary conductor parts in the base part are not connected, and do not disturb the imaging behavior of the antenna.

DESCRIPTION OF THE PREFERRED EMBODIMENTS

Figure 1:
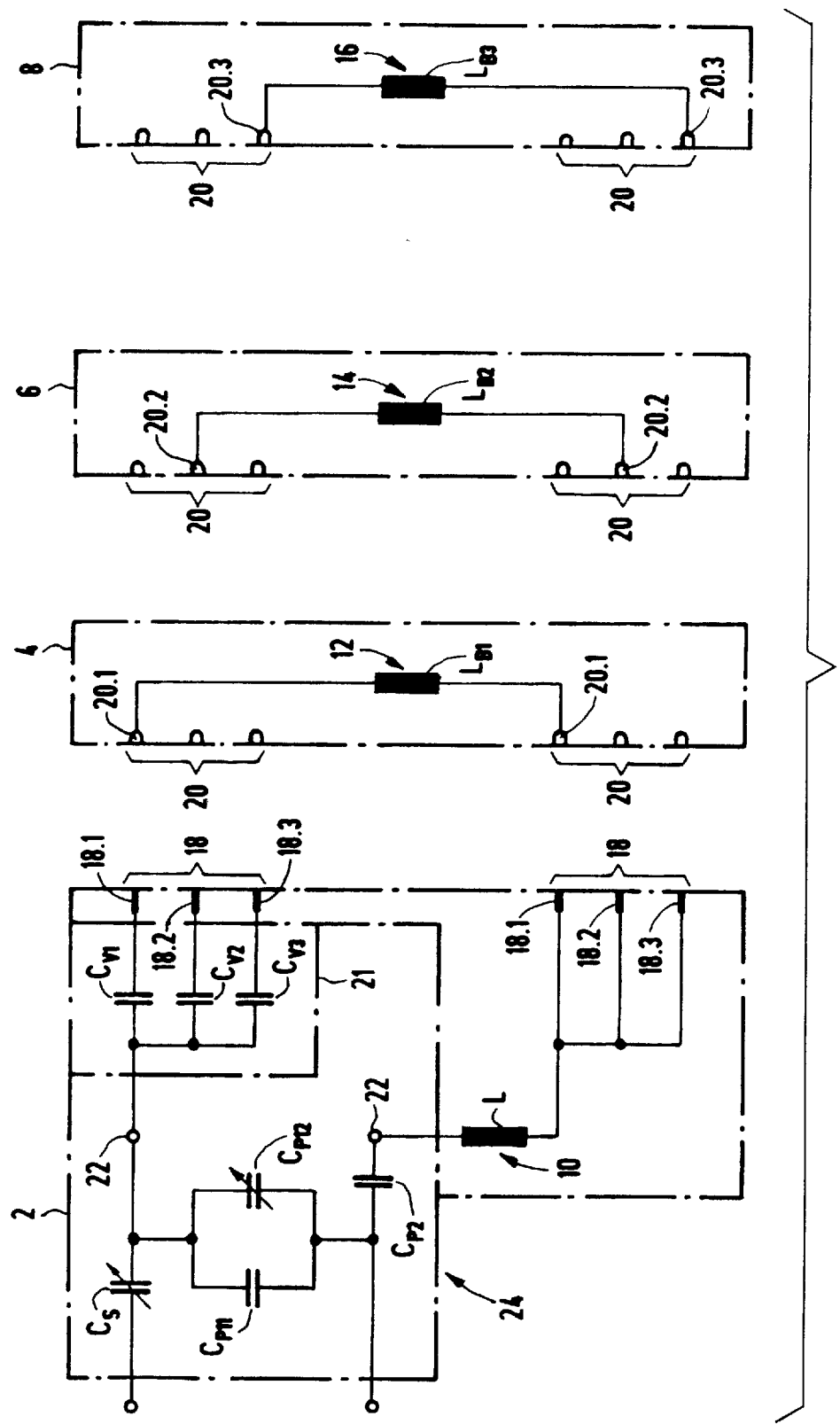
FIG. 1 is a schematic diagram of an inventive antenna system with variable diameter.

The schematic diagram of the inventive antenna system shown in FIG. 1 shows a base part 2 with three bridge parts 4, 6 and 8 of different lengths. The base part 2 and the bridge parts 4, 6 and 8 are of at least partially flexible construction. A first conductor piece 10, arranged in the base part as a part 2 of the antenna, is represented by an equally acting inductance L. Second conductor pieces 12, 14 and 16, each of a different length, are respectively arranged in the bridge parts 4, 6 and 8 as an additional part of the antenna, these conductor pieces being represented by corresponding inductances $L_{B1}$, $L_{B2}$ and $L_{B3}$. Pin-shaped electrical connection means 1 8 are arranged at the ends of the base part 2, and corresponding socket-shaped connection receptacles 20 are arranged at the ends of the bridge parts 4, 6 and 8, so that the base part 2 can be assembled with a bridge part 4, 6 or 8 via the plug connections 18 and 20 to form an antenna that surrounds an imaging volume. The circumferential length of the antenna can be matched to the size of the imaging volume by selecting one of the bridge parts 4, 6 or 8 having an appropriate length.

A network 21 is provided for the compensation of the inductances $L_{B1}$, $L_{B2}$ and $L_{B3}$ of the bridge parts 12, 14 and 16, produced by the different lengths. The network 21, is formed from capacitive elements $C_{V1}$, $C_{V2}$ and $C_{V3}$, and is arranged on the base part 2. The network 21 is connected between one end of the conductor piece 10 arranged in the base part 2 and a contact pin 18.1, 18.2 or 18.3. The number of the contact pins agrees with the number of bridge parts 4, 6 and 8, with one bridge part being allocated to each contact pin. The first bridge part 4 is connected to the contact pin 18.1 via a corresponding contact socket 20.1, the second bridge part 6 is connected to the contact pin 18.2 via a corresponding contact socket 20.2, and the bridge part 8 is connected to the contact pin 18.3 via a corresponding contact socket 20.3. The network 21 is constructed so that an independent current path respectively leads from the end of the conductor piece 10 to one of the contact pins 18.1, 18.2 or 18.3. The capacitance $C_{V1}$, $C_{V2}$ or $C_{V3}$, respectively lying in the current circuit of the bridge parts 4, 6, 8, is dimensioned so that an overall impedance, effective at signal terminals 22 of the antenna, is essentially equally large for each bridge part 4, 6 or 8 connected to the base part 2. The tuning elements of a tuning and matching circuit 24, i.e. capacitors $C_S$, $C_{P11}$, $C_{P12}$, and $C_{P2}$, can be dimensioned so that only deviations from the nominal values caused by the patient must be equalized. The different lengths of the conductor pieces 12, 14 and 16 in the bridge parts 4, 6 and 8 have no influence on the setting range of the tuning and matching circuit 24.

To allow bridge parts 4, 6 and 8 to be arbitrarily plugged onto the base part 2, the other end of the conductor piece 10 is likewise connected to contact pins 18.1, 18.2 and 18.3, that are arranged in the same way. The conductor pieces 12, 14 and 16 in the bridge parts 4, 6 and 8 are respectively connected on both sides with socket contacts arranged in the same way; e.g., in the bridge part 4 the conductor piece 12 is connected on both sides to contact sockets 20.1, etc.

FIG. 1 shows the antenna system with three bridge parts 4, 6 and 8. The design shown therein can also be carried over to additional bridge parts of different lengths, given an equal setting range of the tuning and matching circuit 24.

Figure 2:
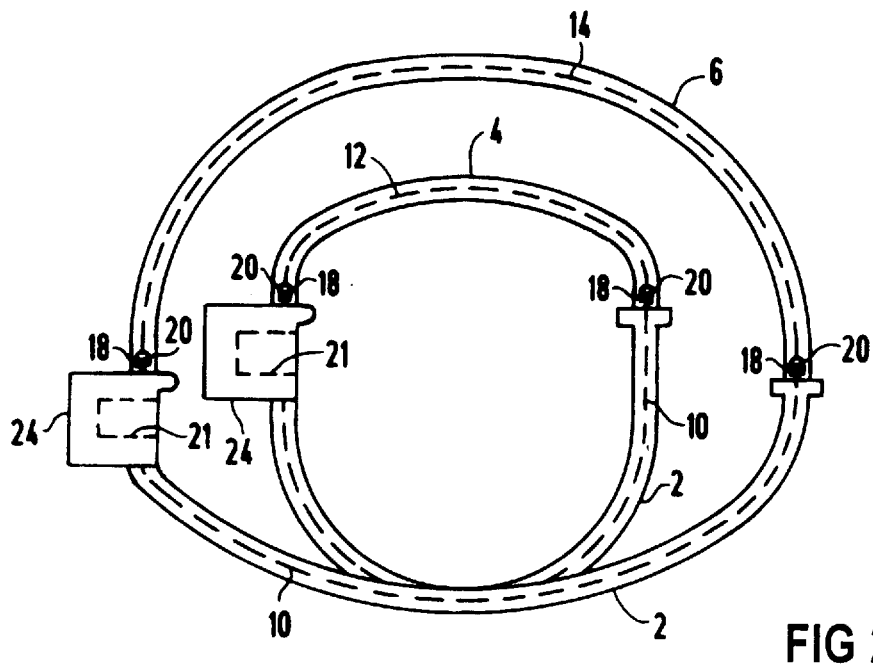
FIG. 2 is, in a side view, a schematic representation of an antenna system with a short bridge part, and, in comparison therewith, an antenna system with a long bridge part.

FIG. 2 shows a side view in the axial direction of the inventive antenna system with a short bridge part 4 and a longer bridge part 6. The antenna formed by the base part 2 and the short bridge part 4 surrounds a small imaging volume 26, while the antenna formed by the base part 2 and the larger bridge part 6 surrounds a larger imaging volume. The network 21 of capacitive elements is arranged in the immediate vicinity of the pin-shaped electrical connection elements 18 in the tuning and matching unit 24 on the base part 2.

Figure 3:
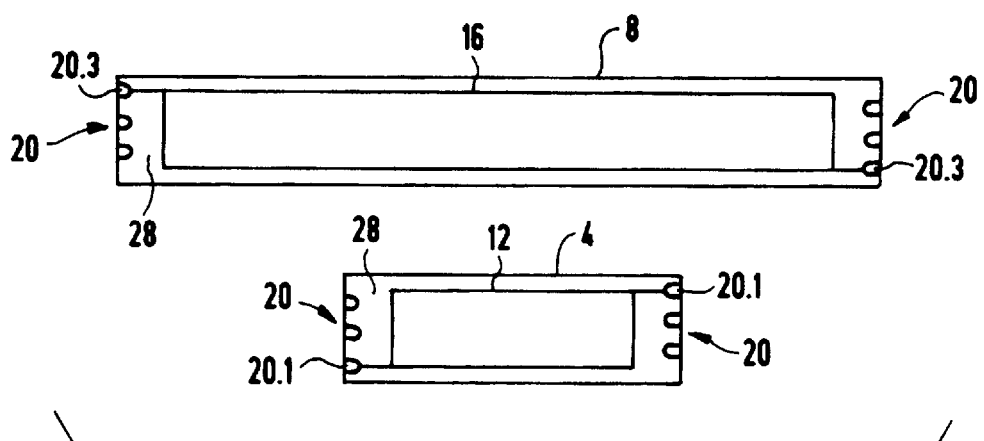
FIG. 3 shows, in a top view, a short and a long bridge part, with symmetrical, exchange-preventing construction.

FIG. 3 shows a top view of an embodiment of the small bridge part 4 and of the large bridge part 8. The conductor part 12 or 16 is fashioned as a strip conductor on both bridge parts 4 and 8, the ends of said conductor being electrically connected respectively with the connection elements 20. The conductor piece 12 is connected with the contacts 20.1 in the short bridge part 4, and the long conductor piece 16 is connected with the contacts 20.3 in the long bridge part 8.

FIG. 3 also shows that the ends of the bridge parts 4, 6, 8 can be plugged arbitrarily onto the base part 2, without having a detrimental effect on the one correct allocation to the corresponding compensating capacitors $C_{V1}$, $C_{V2\ and\ CV3}$.

The conductor pieces 12, 14 and 16 are constructed flexibly and are arranged on a flexible carrier 28 made of plastic material.

Figure 4:
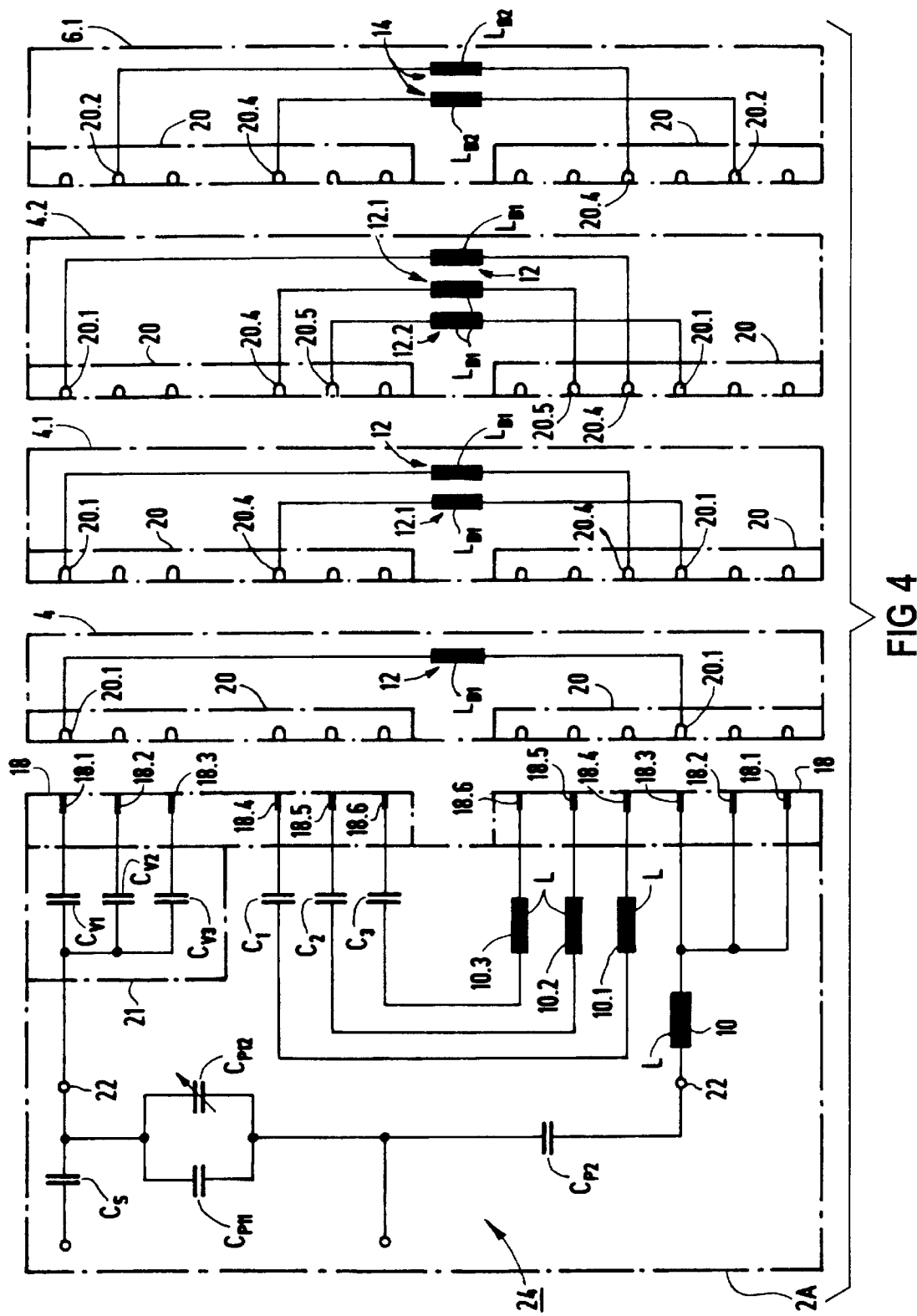
FIG. 4 is a schematic diagram of an antenna system with additional matchable numbers of windings.

FIG. 4 shows the schematic diagram of an antenna system in which, in addition to the diameter of the antenna, the number of windings can also be correspondingly matched to the size of the imaging volume 26. Both the coil diameter and the number of electrical windings have a large influence on the magnetic field and the quality of the antenna, and thus also on the image quality. The antenna quality serves as the most important criterion for the selection of the number of windings of the antenna, however, there are transition regions of the diameter of the antenna at which two different numbers of windings supply an equal quality value. Other parameters can then be used for the selection. For example, given equal diameter of the antenna, the shape of the imaging volume can be influenced by different numbers of windings. A larger number of windings means a greater extension of the imaging volume in the axial direction of the antenna.

In the antenna system shown in FIG. 4 with a variable number of windings, further conductor pieces 10.1, 10.2 and 10.3 are arranged in a base part 2A, parallel to the conductor piece 10. The number of additional conductor pieces 10.1, 10.2 and 10.3 is predetermined by the maximum number of windings of the antenna. The conductor pieces 10.1, 10.2 and 10.3 are respectively connected at the ends with a contact pin 18.4, 18.5 and 18.6 of the electrical connection elements 18. In addition to the bridge parts 4, 6 and 8 already described on the basis of FIG. 1, additional bridge parts 4.1 and 4.2, having the same length as the bridge part 4, and an additional bridge part 6.1, having the same length as the bridge part 6, can be connected to the base part 2A. The bridge parts 4.1, 4.2 and 6.1 have additional conductor parts 12.1, 12.2, 14.1, arranged in parallel with the conductor pieces 12 or 14.

The conductor pieces 12, 12.1 and 12.2 and 6 and 6.1, are connected to the contact sockets 20 in the bridge parts 4.1, 4.2 and 6.1 so as to form additional windings with the additional conductor pieces 10.1, 10.2 and 10.3. For example, the bridge part 4.1 forms, together with the base part 2A, a antenna with two windings, whereby the first winding being formed by the conductor piece 12 with the conductor piece 10.1, and the second winding being formed by the conductor piece 12.1 with the conductor piece 10. An antenna with three windings is formed with the bridge part 4.2. A larger antenna with two windings can be formed with the bridge part 6.1. Here as well, the configuration of the contacts in the connection terminals 18, and 20 is such that the bridges 4.1, 4.2 and 6.1 can be plugged arbitrarily on the base part.

The influence of the additional windings, or of the conductor pieces 10.1, 10.2, 10.3, 12.1, 12.2 and 14.1, on the electrical behavior of the antenna is essentially compensated by capacitances $C_1$, $C_2$ and $C_3$, arranged in the tuning and matching circuit 24 and connected in series with the conductor pieces 10.1, 10.2 and 10.3. The setting range of the tuning elements in the tuning and matching circuit 24 thus remains essentially equal even given variable numbers of windings.

Although modifications and changes may be suggested by those skilled in the art, it is the intention of the inventor to embody within the patent warranted hereon all changes and modifications as reasonably and properly come within the scope of her contribution to the art.

We claim as our invention:

1. An antenna system for a diagnostic magnetic resonance apparatus, said antenna system comprising:

a base part containing a first electrical conductor, said base part having opposite ends;

a plurality of bridge parts of respectively different lengths, each bridge part having opposite ends and each bridge part containing a second electrical conductor having a length substantially equal to the length of the bridge part containing that second electrical conductor;

connection means at said opposite ends of said base part and said opposite ends of each bridge part for releasably electrically connecting a selected one of said bridge parts to said base part for forming an antenna surrounding an imaging volume, said antenna having a circumferential length matched to a size of said imaging volume; and said connection means including, at one of said opposite ends of said base part, a plurality of contacts corresponding in number to the plurality of said bridge parts, with said contacts respectively being exclusively assigned to said bridge parts, and a network comprised of a plurality of capacitive elements connected between said contacts and said first electrical conductor in said base part, said network comprising means for producing a total impedance for said base part and any selected one of said bridge parts which is equally large independent of the length of the selected bridge part.

2. An antenna system as claimed in claim 1, wherein said connection means comprises a plurality of plug connections.

3. An antenna system as claimed in claim 1 wherein said connection means comprises an equal plurality of said contacts at each of said opposite ends of said base part and at each end of each bridge part, with each contact at each of said opposite ends of said base part being respectively exclusively allocated to one of said bridge parts.

4. An antenna system as claimed in claim 1 further comprising signal terminals connected to said first electrical conductor in said base part.

5. An antenna system as claimed in claim 1 further comprising a tuning and matching unit contained in said base part, said network and said tuning and matching unit comprising a structurally integrated unit.

6. An antenna system as claimed in claim 1 wherein said base part and said bridge parts are each at least partially comprised of flexible material.

7. An antenna system as claimed in claim 1 wherein said first electrical conductor and said selected one of said bridge parts connected thereto by said electrical connection means comprise a first winding of said antenna, and said antenna system further comprising:

a plurality of additional first electrical conductors contained in said base part, each additional first electrical conductor having opposite ends;

a plurality of additional bridge parts, each bridge part containing an additional second conductor, each said additional second conductor having opposite ends;

additional connection means at said opposite ends of said additional first electrical conductors and the opposite ends of each additional second electrical conductor for electrically connecting a selected one of said additional bridge pieces to a selected one of said additional first conductors to form a second winding of said antenna having a different circumferential length from said first winding, said second winding having an impedance associated therewith; and a plurality of capacitive elements connected respectively to said additional first electrical conductors in said base part for compensating an overall impedance of said antenna formed by said first and second windings.

8. An antenna system as claimed in claim 7 further comprising a tuning and matching unit contained in said base part, said capacitive elements and said tuning and matching unit comprising an integrated structural unit.

9. An antenna system as claimed in claim 7 wherein said base part, said bridge parts and said additional bridge parts are each comprised at least partially of flexible material.

* * * * *